United States Patent
Chu et al.

(10) Patent No.: US 9,069,692 B2
(45) Date of Patent: Jun. 30, 2015

(54) FULLY PARALLEL ENCODING METHOD AND FULLY PARALLEL DECODING METHOD OF MEMORY SYSTEM

(71) Applicant: NATIONAL CHIAO TUNG UNIVERSITY, Hsinchu (TW)

(72) Inventors: Chia-Ching Chu, Taichung (TW); Yi-Min Lin, Taipei (TW); Chi-Heng Yang, New Taipei (TW); Hsie-Chia Chang, Hsinchu (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 242 days.

(21) Appl. No.: 13/853,079

(22) Filed: Mar. 29, 2013

(65) Prior Publication Data

US 2014/0095960 A1   Apr. 3, 2014

(30) Foreign Application Priority Data

Sep. 28, 2012   (TW) .............................. 101135990 A

(51) Int. Cl.
*H03M 13/00* (2006.01)
*G06F 11/10* (2006.01)
*H03M 13/15* (2006.01)

(52) U.S. Cl.
CPC .............. *G06F 11/10* (2013.01); *H03M 13/152* (2013.01); *H03M 13/1525* (2013.01); *H03M 13/1545* (2013.01); *H03M 13/611* (2013.01); *H03M 13/617* (2013.01); *H03M 13/6561* (2013.01)

(58) Field of Classification Search
CPC .............. H03M 13/15; H03M 13/151; H03M 13/1515; H03M 13/1545; H03M 13/1555
See application file for complete search history.

(56) References Cited

U.S. PATENT DOCUMENTS

| 5,444,719 | A | 8/1995 | Cox et al. | |
|---|---|---|---|---|
| 5,642,367 | A * | 6/1997 | Kao | 714/784 |
| 6,920,600 | B2 * | 7/2005 | Litwin et al. | 714/784 |
| 6,990,624 | B2 * | 1/2006 | Dohmen et al. | 714/785 |
| 6,994,476 | B1 * | 2/2006 | Yang | 385/53 |
| 7,020,826 | B2 * | 3/2006 | Litwin et al. | 714/784 |
| 7,694,207 | B1 * | 4/2010 | Kline et al. | 714/782 |
| 8,499,219 | B2 * | 7/2013 | Wang | 714/758 |
| 8,640,013 | B2 * | 1/2014 | Hida et al. | 714/784 |
| 8,667,369 | B2 * | 3/2014 | Kong et al. | 714/763 |

OTHER PUBLICATIONS

G. Fettweis and M. Hassner, "A Combined Reed-Solomon Encoder and Syndrome Generator with Small Hardware Complexity," IEEE ISCAS, vol. 4, pp. 1871-1874, May 1992.
X. Wang, D. Wu, C. Hu, L. Pan, and R. Zhou, "Embedded high-speed BCH decoder for new-generation NOR flash memories," in IEEE Custom Integrated Circuits Conference, pp. 195-198, Sep. 2009.

* cited by examiner

*Primary Examiner* — Esaw Abraham
(74) *Attorney, Agent, or Firm* — CKC & Partners Co., Ltd.

(57) ABSTRACT

A memory system, a fully parallel encoding method, and a fully parallel decoding method are disclosed. The encoding method utilizes a plurality of minimal polynomials that constitute a generator polynomial to derive a plurality of roots from the minimal polynomials. A first encoding matrix derived according to the roots of the minimal polynomials is subsequently decomposed to derive a second encoding matrix, in which partial elements of the second encoding matrix are common in those of a parity check matrix of the decoder, such that the encoder and the decoder can efficiently share the same hardware. In addition, the decoding method defines a new error locator polynomial and utilizes a cubic matrix operation to respectively combine the equations, which reduces the hardware required by the fully parallel architecture.

15 Claims, 6 Drawing Sheets

FULLY PARALLEL ENCODING METHOD AND FULLY PARALLEL DECODING METHOD OF MEMORY SYSTEM

RELATED APPLICATIONS

This application claims priority to Taiwan Application Serial Number 101135990, filed Sep. 28, 2012, which is herein incorporated by reference.

BACKGROUND

1. Field of Invention

The present invention relates to a memory. More particularly, the present invention relates to a codec of memory.

2. Description of Related Art

In recent years, since the performance demands for NOR flash memories in the applications, such as consumer electronic products are increasing and the manufacturing process is scaling down, the NOR flash memories face extreme challenges in their reliability. Gradually, the conventional single error correcting codes is no longer sufficient in performance. The NOR flash memories is mainly used to store the control program of a system. In addition to the NOR flash memories are widely used in the Personal Computer (PC) products and consumer electronic products, such as the digital camera, the DVD player, the MP3 music player, the printer, the set top box (DVB-S,-T), and the automobile electronics, etc.

The NOR flash memory features executing in place (XIP), which makes an application program directly operate in the NOR flash memory, instead of reading the codes to the random access memory (RAM). Therefore, the transmission of the NOR flash memory works very efficiently with no need of long boot time.

At first the storage spaces of the NOR flash memory is limited and the writing speed is slow. But because of its high speed in random access, the NOR flash memory mainly targets on the applications of the consumer electronics of the embedded memory, such as the mobile phone and the digital still camera (DSC), and the digital video recorder, etc. Recently, the demands, such as the automobiles electronics, the consumer electronics, the video game consoles (e.g. Nintendo Wii®, XBOX®, Play Station3®, etc.), and the intelligent ammeters are in power, and thus the NOR flash memory plays a more and more important role in the technology industry, especially for the market of automobile, e.g. the digital dashboard, the satellite navigation system, the in-car entertainment systems, the digital TV, and the set top box (STB), etc.

For a memory cell, the bit error rate (BER) of the memory cell is going to be as high as $10^{-6}$ and even worse after the manufacturing process reaches 45 nm. However, in the NOR flash applications, the BER should be less than $10^{-12}$ for providing enough reliability. As a result, the error correcting codes (ECC) is used for ensuring adequate reliability to meet the specification of the products. Formerly, the single-error-correcting code (SEC), such as Hamming code, can detects two errors and corrects an error of a bit.

However, with the advance of nanoscale manufacturing process, the error correcting capacity of Hamming code is apparently not enough. Even if the Hamming code is replaced by the Bose-Chaudhuri-Hochquenghem (BCH) code, which can correct more than one error bit, the circuitry of BCH code is still too complex to provide the speed of decoding fast enough to keep up with the demands for electronics devices nowadays.

Therefore, there is a need for a new method of fully parallel encoding and decoding, which is used for accelerating the speed of encoding and decoding and simultaneously reduces the complexity of the circuitry.

SUMMARY

The present invention, in one aspect, provides a method of fully parallel encoding of a memory system, which can accelerate the speed of encoding and decoding and simultaneously reduce the required hardware circuit and the circuit complexity.

According to an aspect of the present invention, the method of fully parallel encoding of a memory system includes the steps of factorizing a generator polynomial in the encoding procedure into a plurality of minimal polynomials; deriving the plurality of roots from the minimal polynomials; and generating an encoding matrix from the plurality of roots or factorizing the plurality of roots into a plurality of factorized matrices.

In one embodiment, the method of fully parallel encoding of a memory system includes the following steps. First, a generator polynomial in the encoding procedure is factorized into a plurality of minimal polynomials at first. Then, the plurality of roots are derived from the minimal polynomials; later, a plurality of equations from the roots of the minimal polynomials are obtained, and a first encoding matrix is generated from the equations. Afterwards, the first encoding matrix is factorized to a second encoding matrix, which is one sub-matrix of a parity check matrix of a decoder; and encoding is conducted from the second encoding matrix.

In other aspect of the present invention, a method of fully parallel decoding of the memory system includes the steps of deriving the plurality of syndromes from a parity check matrix at first, wherein the partial elements of the parity check matrix are common in a factorized matrix of an encoder; deriving an error locator polynomial from the syndromes and substituting a plurality of primitive elements to the error locator polynomial for obtaining a plurality of roots of the error locator polynomial. When there is an error in a codeword, deriving the root of the error locator polynomial for finding a corresponding error location.

In other aspect, the present invention provides a method of fully parallel decoding of a memory system, which can achieve the same error correcting capability with a smaller area of circuitry than that by the methods in the art.

In another aspect, the present invention provides a memory system, which can accelerates the speed of encoding and decoding and simultaneously reduces the required area of circuit in the same error correcting capability.

In an embodiment, the memory system includes: (a) an encoder for utilizing a second encoding matrix to encode an input data for generating a codeword, wherein the code includes the parity bits; (b) a memory cell for storing operation from the codeword and the parity bits; (c) A write circuit electrically coupled to the encoder for transmitting the codeword and the parity bits to the memory cell; (d) a read circuit for reading the data from the memory cell; and (e) a decoder for utilizing a parity matrix to decode a data read from the memory cell.

The memory system and the method of fully parallel encoding and decoding of the foregoing embodiments use the fully parallel architecture to accelerate the speed of encoding and reduces the latency of decoding, so that the memory system and the method of fully parallel encoding and decoding have a ability of encoding and decoding in high speed, which accelerates the reading and writing speed of the memory. On the other hand, an improved algorithm is applied to efficiently share the hardware of the encoding and the decoding, which eliminates the need for the hardware of the encoding and reduces the longest path of latency of decoding. As a result, the total area in the memory system and the cost of hardware can be significantly reduced.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
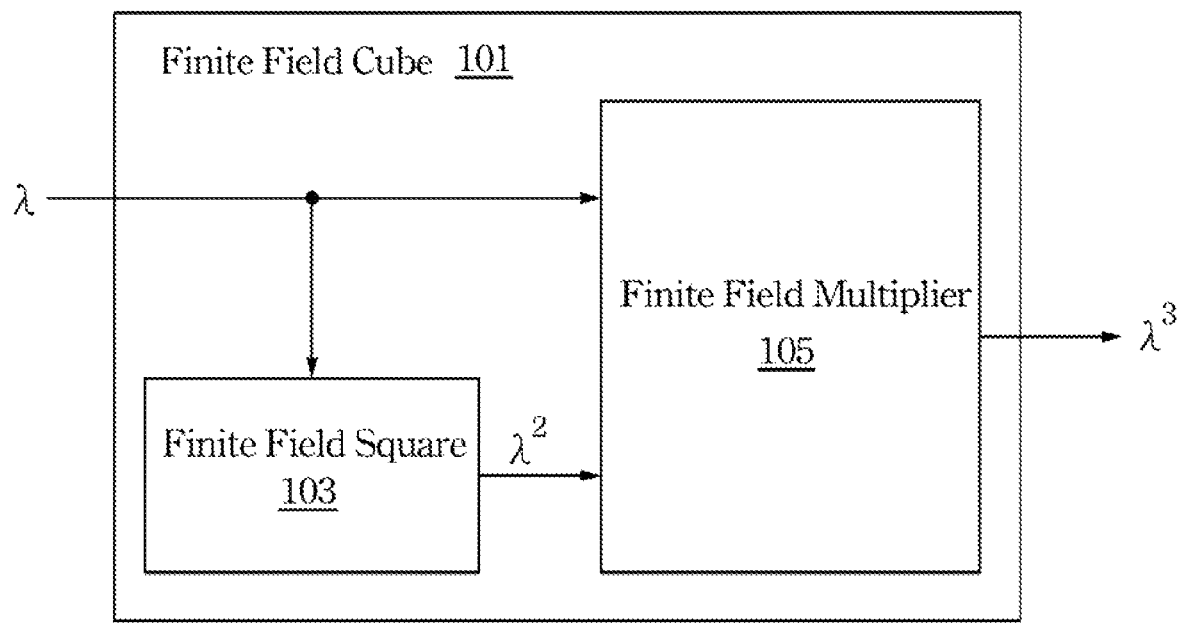
FIG. 1 is the schematic of the cube according to one embodiment of this invention.

Reference will now be made in detail to the present embodiments of the invention, examples of which are illustrated in the accompanying drawings. Wherever possible, the same reference numbers are used in the drawings and the description to refer to the same or like parts.

With the progress of memory and the demands for entertainment of the general public, the electronic programming guides (EPG) of the STB requests to the NOR flash memory is increasing gradually. The functions of the EPG are more diversification and more complex. If the contents of the EPG were stored at the volatile memory, such as the dynamic random access memory (DRAM), where the power off, it has to takes several hours to recover completely. It's different if these contents were stored at the NOR memory, the contents can be preserved well whether the power is on or off due to the feature of the non-volatile. Therefore, the contents of the EPG need to stored at the NOR memories with high density.

Many car manufacturers are going to use the memory with high performance to reduce the boot time in the new electronic dashboard and information entrainment system. The NOR flash memory can meets this demand. It provides a quick boot time and giving feedback constantly with high reliability. These features are necessary for the safety-driving environment, which is the car manufacturers want to provide to the driver. And the voice recognition systems build in the car and the consumer electronics are based to the lot of related technologies of the memory, where they want to achieve to be processing quickly and correctly the related commands for reducing the time of searching and responding and increasing the accuracy of voice searching. The chips of the NOR flash memory with high capacity of storage, which is up to 256 Mb, 512 Mb, even 1 Gb are very important in these fields.

After introducing the Double-Error-correcting code (DEC), such as Bose-Chaudhuri-Hocquenghem code (BCH), the bit error rate can be reduced to about $10^{-13}$. Thus, the NOR flash memory with DEC and BCH can meet the required reliability of the products.

In the condition that the length of codeword and the error correcting capability are same, the one of embodiments of this invention is related to a BCH codec with fully parallel architecture for reduce the hardware complexity. Furthermore, the one of embodiments of this invention uses the error locator polynomial with new definition, which has less time of decoding compared to the error locator polynomial from the Peterson's algorithm. Compared with the decoder in the prior art, the codec in one embodiments of this invention have a high advantage in the area and the cost.

1. Basic Operations of Finite Fields

Constant Finite Field Multiplier (CFFM)

Each arbitrary element over the finite field $GF(2^m)$ can be presented as $\lambda = \lambda_0 + \lambda_1 \alpha + \ldots + \lambda_{m-1} \alpha^{m-1}$, with the binary coordinate $\lambda_i$ and the basis $\{\alpha^0, \alpha^1, \ldots, \alpha^{m-1}\}$. Hence, the multiplication between a constant symbol $\alpha^j$ and an arbitrary symbol $\lambda$, $\alpha^j \times \lambda$, can be expressed as $$\alpha^j \times \lambda = \alpha^j \times (\lambda_0 + \lambda_1 \alpha + \ldots + \lambda_{m-1} \alpha^{m-1})$$

$$= \lambda_0 \alpha^j + \lambda_1 \alpha^{j+1} + \ldots + \lambda_{m-1} \alpha^{j+m-1}$$

$$= \begin{bmatrix} \alpha_0^j & \alpha_0^{j+1} & \cdots & \alpha_0^{j+m-1} \\ \alpha_1^j & \alpha_1^{j+1} & \cdots & \alpha_1^{j+m-1} \\ \vdots & \vdots & \ddots & \vdots \\ \alpha_{m-1}^j & \alpha_{m-1}^{j+1} & \cdots & \alpha_{m-1}^{j+m-1} \end{bmatrix} \begin{bmatrix} \lambda_0 \\ \lambda_1 \\ \vdots \\ \lambda_{m-1} \end{bmatrix}$$

$$= C^j \lambda$$

Where the binary element $\alpha_i^p$ stands for the I-th coordinate of $\alpha^p$ and $C^j$ is considered as a multiplicator matrix of constant finite field multiplier (CFFM) with the constant $\alpha^j$.

Square

Each arbitrary element, $\lambda$, over $GF(2^m)$ can be considered as a polynomial with binary coefficients, so the calculation of square can be defined as:

$$\lambda^2 = (\lambda_0 + \lambda_1 \alpha + \ldots + \lambda_{m-1} \alpha^{m-1})^2$$

$$= \lambda_0 + \lambda_1 \alpha^2 + \ldots + \lambda_{m-1} \alpha^{2(m-1)}$$

$$= (\lambda_0 + \lambda_1 x + \ldots + \lambda_{m-1} x^{m-1})|_{x=\alpha^2}$$

$$= \begin{bmatrix} \alpha_0^0 & \alpha_0^2 & \cdots & \alpha_0^{2(m-1)} \\ \alpha_1^0 & \alpha_1^2 & \cdots & \alpha_1^{2(m-1)} \\ \vdots & \vdots & \ddots & \vdots \\ \alpha_{m-1}^0 & \alpha_{m-1}^2 & \cdots & \alpha_{m-1}^{2(m-1)} \end{bmatrix} \begin{bmatrix} \lambda_0 \\ \lambda_1 \\ \vdots \\ \lambda_{m-1} \end{bmatrix}$$

$$= Q\lambda$$

From the matrix described before, for each arbitrary polynomial with binary coefficients $f(x)$, the computation of $f(x^2)$ can be derived from $f^2(x)$.

Cube

Traditionally, as shown in FIG. 1, a cube 101 can be constructed by a square 103 and a multiplier 105. The critical path of this architecture can be can be estimated as $(\log_2 m + \log_2 (2m-2)+1) \cdot \tau_{XOR} + \tau_{AND}$, where $\tau_{XOR}$ and $\tau_{AND}$ denotes the delay of XOR gate and AND gate, respectively. In order to reduce the latency, $\lambda^3$ can be rewritten as matrix form in this invention:

$$\lambda^3 = (\lambda_0 + \lambda_1\alpha + \ldots + \lambda_{m-1}\alpha^{m-1})^3$$

$$= \lambda_0 + \lambda_0\lambda_1\alpha + (\lambda_0\lambda_1 + \lambda_0\lambda_2)\alpha^2 + \ldots + \lambda_{m-1}\alpha^{3(m-1)}$$

$$= \begin{bmatrix} \alpha_0^0 & \alpha_0^1 & \alpha_0^2 & \ldots & \alpha_0^{3(m-1)} \\ \alpha_1^0 & \alpha_1^1 & \alpha_1^2 & \ldots & \alpha_1^{3(m-1)} \\ \alpha_2^0 & \alpha_2^1 & \alpha_2^2 & \ldots & \alpha_2^{3(m-1)} \\ \vdots & \vdots & \vdots & \ddots & \vdots \\ \alpha_{m-1}^0 & \alpha_{m-1}^1 & \alpha_{m-1}^2 & \ldots & \alpha_{m-1}^{3(m-1)} \end{bmatrix} \begin{bmatrix} \lambda_0 \\ \lambda_0\lambda_1 \\ \lambda_0\lambda_1 + \lambda_0\lambda_2 \\ \vdots \\ \lambda_{m-1} \end{bmatrix}$$

Note that the critical path of our proposed cubic operation is $(\log_2(3m-3)+1)\cdot\tau_{XOR}+\tau_{AND}$. In one embodiment, m=9, the cube 101 can reduce the latency of three XOR gates, and FIG. 1 shows the schematic of the cube according to one embodiment of this invention.

2. Combine Encoder and Syndrome Calculator

In one of embodiments, the encoder and the decoder uses the Bose-Chaudhuri-Hocquenghem (BCH) code, wherein the architecture of the encoder and the decoder is fully parallel, and the hardware of the syndrome calculator of the decoder and the encoder can be shared. The encoder uses the systematic encoding, $u(x)x^{n-k}=q(x)g(x)+p(x)$, where $u(x)$ is a message polynomial, $p(x)$ is a parity matrix, and $g(x)$ is a generator polynomial, which can be defined as:

$$g(x) = LCM\{M_1(x), M_2(x), \ldots, M_2(x)\}$$
$$= M_1(x) \times M_3(x) \times \ldots \times M_{2t-1}(x)$$
$$= g_{n-k}x^{n-k} + \ldots + g_2x^2 + g_1x + g_0$$

Where $M_i(x)$ is the i-th minimal polynomial with binary coefficients. Note that $\alpha^i$ and its conjugates are the roots of the i-th minimal polynomial. Taking all the roots of generator polynomial into the systematic encoding to get the n−k equations, which can be expressed as $P(x)=u(x)x^{n-k}|x=\alpha^i$ and their conjugates, where i=1, 3, ..., 2t−1. To express the n−k equations in matrix form as:

$$\begin{bmatrix} 1 & \alpha & \ldots & \alpha^{n-k-1} \\ 1 & \alpha^2 & \ldots & \alpha^{2\times(n-k-1)} \\ \vdots & \vdots & \ddots & \vdots \\ 1 & \alpha^{(2t-1)\times 2^j 2^{t-1}-1} & \ldots & \alpha^{(2t-1)\times 2^j 2^{t-1}-1 \times(n-k-1)} \end{bmatrix}$$

$$\begin{bmatrix} p_0 \\ p_1 \\ \vdots \\ p_{n-k-1} \end{bmatrix} = \begin{bmatrix} \alpha^{n-k} & 0 & \ldots & 0 \\ 0 & \alpha^{2(n-k)} & \ddots & \vdots \\ \vdots & \ddots & \ddots & 0 \\ 0 & \ldots & 0 & \alpha^{(2t-1)\times 2^j 2^{t-1}-1 \times(n-k)} \end{bmatrix}$$

$$\begin{bmatrix} 1 & \alpha & \ldots & \alpha^{k-1} \\ 1 & \alpha^2 & \ldots & \alpha^{2\times(k-1)} \\ \vdots & \vdots & \ddots & \vdots \\ 1 & \alpha^{(2t-1)\times 2^j 2^{t-1}-1} & \ldots & \alpha^{(2t-1)\times 2^j 2^{t-1}-1 \times(k-1)} \end{bmatrix} \begin{bmatrix} u_0 \\ u_1 \\ \vdots \\ u_{k-1} \end{bmatrix}$$

Where, $I_i$ denotes the number of $\alpha^i$. For conveniences of description, we rewritten the matrix as $BP=AH_{EN}U$.

By definition, $g(x)=M_1(x)\times M_3(x)\times \ldots \times M_{2t-1}(x)$, which can be divided into parts based on the minimal polynomial, we can use the concept of the square, which is described in the first part of this chapter:

$$\lambda^{2^j} = \left(\left((\lambda_0 + \lambda_1\alpha + \ldots + \lambda_{m-1}\alpha^{m-1})^2\right)^2 \ldots \right)^2$$

$$= \lambda_0 + \lambda_1\alpha^{2^j} + \ldots + \lambda_{m-1}\alpha^{2^j(m-1)}$$

$$= (\lambda_1 + \lambda_1 x + \ldots + \lambda_{m-1}x^{m-1})|_{x=\alpha^{2^j}}$$

$$= \begin{bmatrix} \alpha_0^0 & \alpha_0^{2^j} & \ldots & \alpha_0^{2^j(m-1)} \\ \alpha_1^0 & \alpha_1^{2^j} & \ldots & \alpha_1^{2^j(m-1)} \\ \vdots & \vdots & \ddots & \vdots \\ \alpha_{m-1}^0 & \alpha_{m-1}^2 & \ldots & \alpha_{m-1}^{2^j(m-1)} \end{bmatrix} \begin{bmatrix} \lambda_0 \\ \lambda_1 \\ \vdots \\ \lambda_{m-1} \end{bmatrix}$$

$$= Q(\ldots(Q(Q\lambda)))$$

$$= Q^j\lambda$$

We factorized the matrix $H_{EN}$, $H_{EN}=Q_{EN}\cdot\tilde{H}_{EN}$, where $Q_{EN}$ and $\tilde{H}_{EN}$ is:

$$Q_{EN} = \begin{bmatrix} Q_1 & 0 & \ldots & 0 \\ 0 & Q_3 & \ddots & \vdots \\ \vdots & \ddots & \ddots & 0 \\ 0 & \ldots & 0 & Q_{2t-1} \end{bmatrix},$$

$$Q_i = \begin{bmatrix} Q^0 \\ Q^1 \\ \vdots \\ Q^{l_i} \end{bmatrix}, Q^0 = \begin{bmatrix} 1 & 0 & \ldots & 0 \\ 0 & 1 & \ddots & \vdots \\ \vdots & \ddots & \ddots & 0 \\ 0 & \ldots & 0 & 1 \end{bmatrix}$$

$$\tilde{H}_{EN} = \begin{bmatrix} 1 & \alpha & \ldots & \alpha^{k-1} \\ 1 & \alpha^3 & \ldots & \alpha^{3(k-1)} \\ \vdots & \vdots & \ddots & \vdots \\ 1 & \alpha^{2t-1} & \ldots & \alpha^{(2t-1)\times(k-1)} \end{bmatrix}$$

From the aforesaid equation, we can find that the matrix $\tilde{H}_{EN}$ is a sub-matrix of the parity check matrix $\tilde{H}_{SYN}$, so that the hardware can be shared with syndrome calculator.

Therefore, $BP=AH_{EN}U$ can be rewritten as $BP=AQ_{EN}\tilde{H}_{EN}U$. Further, there exists an inverse matrix due to B is a non-singular matrix, so that the parity bits can be obtained by $P=B^{-1}AQ_{EN}\tilde{H}_{EN}U=E\tilde{H}_{EN}U$, where the matrix E is equal to $B^{-1}AQ_{EN}$. Note that after the message length and the error correcting capability is decided, the matrix E and $\tilde{H}_{EN}$ can be obtained by the computer program, such as C/C++ or Matlab, without extra hardware cost.

The operation of matrix is a series of addition and multiplication. From the concept of CFFM described in the first part of this chapter, where multiplying each elements of matrix E is equivalent to get a m-bit element over $GF(2^m)$ by multiplying a m×m constant multiplication matrix. Afterwards, we get a parity bit by adding the corresponding result of multiplication. But each element in parity bits is a one-bit symbol. For this reason, each CFFM in matrix E can be reduced to one row as:

$$\alpha^j \times \lambda = \alpha^j \times (\lambda_0 + \lambda_1 \alpha + \ldots + \lambda_{m-1} \alpha^{m-1})$$

$$= \begin{bmatrix} \alpha_0^j & \alpha_0^{j+1} & \ldots & \alpha_0^{j+m-1} \end{bmatrix} \begin{bmatrix} \lambda_0 \\ \lambda_1 \\ \lambda_2 \\ \vdots \\ \lambda_{m-1} \end{bmatrix}$$

$$= C_E^j \lambda$$

Where $C_E^j$ is called a CFFM with $\alpha^j$ as the constant multiplicator of the matrix E.

By factorizing the conventional encoding matrix, one of the factorized matrices can share hardware with syndrome calculator. The syndrome is calculator only adds a little bit of number of extra hardware for encoding. Table 1 demonstrates the estimated XOR gates of proposed method with comparison with the prior art. Where n is the length of codeword, k is the length of message, t is the error correcting capacity and m is a parameter of the finite field. Table 2 demonstrates the implementation result of joint encoder and syndrome calculator from UMC 90 nm 1P9M CMOS technology and the comparison result with the prior art. From table 1 and table 2, in one embodiment, we can find that the proposed hardware with 256-bit or 512-bits data length and 2-bit or 3-bit error correcting capacity can saves at least forty percent of the hardware complexity in the prior art. It means the proposed hardware in one embodiment not only meets the demands of the reliability of the NOR flash memory in nowadays but also has a advantage in low hardware complexity even there is a need for 3-bit or more error correcting code, when 2-bit error correcting code is not enough in the future.

TABLE 1

| (N, k; t) | One embodiment of this invention $mt \times mt + mt \times n$ | Prior art $k \times mt + mt \times n$ | Area saving (%) |
|---|---|---|---|
| (274, 256; 2) | $324 \times \rho_{Eavg} + 4932 \times \rho_{Savg}$ | $4608 \times \rho_{Eavg} + 4932 \times \rho_{Savg}$ | 45% |
| (283, 256; 3) | $729 \times \rho_{Eavg} + 7398 \times \rho_{Savg}$ | $6912 \times \rho_{Eavg} + 7398 \times \rho_{Savg}$ | 43% |
| (532, 512; 2) | $400 \times \rho_{Eavg} + 10640 \times \rho_{Savg}$ | $10240 \times \rho_{Eavg} + 10640 \times \rho_{Savg}$ | 47% |
| (542, 512; 3) | $900 \times \rho_{Eavg} + 16260 \times \rho_{Savg}$ | $15360 \times \rho_{Eavg} + 6260 \times \rho_{Savg}$ | 46% |

TABLE 2

| (n, k; t) | One embodiment of this invention | Prior art | Area saving (%) |
|---|---|---|---|
| (274, 256; 2) | 2671 | 4621 | 42% |
| (283, 256; 3) | 4100 | 6904 | 41% |
| (532, 512; 2) | 5105 | 9234 | 45% |
| (542, 512; 3) | 7745 | 13707 | 43% |

Table 1 estimated the number of XOR gates by the dimension of the matrix, where $\rho_{avg}$ is the average density of "1" in each multiplicand matrix, $\rho_{Savg}$ is the average density of the correlation matrix of the syndrome calculator, and $\rho_{Eavg}$ is the average density of the correlation matrix of encoding. Table 2 demonstrates the comparison of the gate count of the encoder and the syndrome calculator. For the BCH decoder with low complexity, BCH decoder first calculate the syndromes $S_1$, $S_2$, ..., $S_{2t}$. Because the even number of syndromes is the linear combination of the odd number of syndromes, it only calculates t syndromes $S_1, S_3, \ldots, S_{2t-1}$. Taking the BCH decoder with double error correcting for example, the calculation of syndromes is described as:

$$\begin{bmatrix} S_1 \\ S_3 \end{bmatrix} = \begin{bmatrix} 1 & \alpha & \ldots & \alpha^{k-1} \\ 1 & \alpha^3 & \ldots & \alpha^{3(k-1)} \end{bmatrix} \begin{bmatrix} r_0 \\ r_1 \\ \vdots \\ r_{k-1} \end{bmatrix} = \tilde{H}_{SYN} \cdot R$$

After getting $S_1$ and $S_3$, we adopt the reversed error locator polynomial for subsequent processing due to its shorter latency compared with Peterson's algorithm. For a double error correcting BCH decoder, the reversed error locator polynomial is $$\sigma(x) = S_1 x^2 + S_1^2 x + (S_1^3 + S_3) = \sigma^{(1)}(x) + (S_1^3 + S_3)$$

After the error locator polynomial is decided, Chien search is performed by substituting $\alpha^0, \alpha^1, \ldots, \alpha^{n-1}$ into the error locator polynomial. If $\alpha^i$ is the root of the error locator polynomial, the i-th bit is erroneous. From the above equation, we can find that $S_1 x^2 + S_1^2 x$ is the main cause of the high hardware complexity when performing Chien search. Therefore, we proposed two methods for the operation of $S_1 x^2 + S_1^2 x$.

First Embodiment

Because $S_1$ is an element over $GF(2^m)$, assuming that $S_1$ is $\alpha^j$, $S_1 x^2 + S_1^2 x$ can be written as $\alpha^j x^2 + \alpha^{2j} x$. Then, we use the concept of the CFFM and the square for the following derivation:

$$\alpha^j x^2 + \alpha^{2j} x = \begin{bmatrix} \alpha_0^j & \alpha_0^{j+1} & \ldots & \alpha_0^{j+m-1} \\ \alpha_1^j & \alpha_1^{j+1} & \ldots & \alpha_1^{j+m-1} \\ \vdots & \vdots & \ddots & \vdots \\ \alpha_{m-1}^j & \alpha_{m-1}^{j+1} & \ldots & \alpha_{m-1}^{j+m-1} \end{bmatrix} \begin{bmatrix} x_0^2 \\ x_1^2 \\ \vdots \\ x_{m-1}^2 \end{bmatrix} +$$

$$\begin{bmatrix} \alpha_0^{2j} & \alpha_0^{2j+1} & \ldots & \alpha_0^{2j+m-1} \\ \alpha_1^{2j} & \alpha_1^{2j+1} & \ldots & \alpha_1^{2j+m-1} \\ \vdots & \vdots & \ddots & \vdots \\ \alpha_{m-1}^{2j} & \alpha_{m-1}^{2j+1} & \ldots & \alpha_{m-1}^{2j+m-1} \end{bmatrix} \begin{bmatrix} x_0 \\ x_1 \\ \vdots \\ x_{m-1} \end{bmatrix}$$

$$= \begin{bmatrix} \alpha_0^j & \alpha_0^{j+1} & \ldots & \alpha_0^{j+m-1} \\ \alpha_1^j & \alpha_1^{j+1} & \ldots & \alpha_1^{j+m-1} \\ \vdots & \vdots & \ddots & \vdots \\ \alpha_{m-1}^j & \alpha_{m-1}^{j+1} & \ldots & \alpha_{m-1}^{j+m-1} \end{bmatrix} \begin{bmatrix} 1 & \alpha_0^2 & \ldots & \alpha_0^{2(m-1)} \\ 0 & \alpha_1^2 & \ldots & \alpha_1^{2(m-1)} \\ \vdots & \vdots & \ddots & \vdots \\ 0 & \alpha_{m-1}^2 & \ldots & \alpha_{m-1}^{2(m-1)} \end{bmatrix} \begin{bmatrix} x_0 \\ x_1 \\ \vdots \\ x_{m-1} \end{bmatrix} +$$

$$\begin{bmatrix} \alpha_0^{2j} & \alpha_0^{2j+1} & \ldots & \alpha_0^{2j+m-1} \\ \alpha_1^{2j} & \alpha_1^{2j+1} & \ldots & \alpha_1^{2j+m-1} \\ \vdots & \vdots & \ddots & \vdots \\ \alpha_{m-1}^{2j} & \alpha_{m-1}^{2j+1} & \ldots & \alpha_{m-1}^{2j+m-1} \end{bmatrix} \begin{bmatrix} x_0 \\ x_1 \\ \vdots \\ x_{m-1} \end{bmatrix}$$

$$
\begin{aligned}
&= \begin{bmatrix} \alpha_0^j & \alpha_0^{j+2} & \cdots & \alpha_0^{j+2(m-1)} \\ \alpha_1^j & \alpha_1^{j+2} & \cdots & \alpha_{m-1}^{j+2(m-1)} \\ \vdots & \vdots & \ddots & \vdots \\ \alpha_{m-1}^j & \alpha_{m-1}^{j+2} & \cdots & \alpha_{m-1}^{j+2(m-1)} \end{bmatrix} \begin{bmatrix} x_0 \\ x_1 \\ \vdots \\ x_{m-1} \end{bmatrix} + \\
&\quad \begin{bmatrix} \alpha_0^{2j} & \alpha_0^{2j+1} & \cdots & \alpha_0^{2j+m-1} \\ \alpha_1^{2j} & \alpha_1^{2j+1} & \cdots & \alpha_1^{2j+m-1} \\ \vdots & \vdots & \ddots & \vdots \\ \alpha_{m-1}^{2j} & \alpha_{m-1}^{2j+1} & \cdots & \alpha_{m-1}^{2j+m-1} \end{bmatrix} \begin{bmatrix} x_0 \\ x_1 \\ \vdots \\ x_{m-1} \end{bmatrix} \\
&= \begin{bmatrix} \alpha_0^j + \alpha_0^{2j} & \alpha_0^{j+2} + \alpha_0^{2j+1} & \cdots & \alpha_0^{j+2(m-1)} + \alpha_0^{2j+m-1} \\ \alpha_1^j + \alpha_1^{2j} & \alpha_1^{j+2} + \alpha_1^{2j+1} & \cdots & \alpha_1^{j+2(m-1)} + \alpha_1^{2j+m-1} \\ \vdots & \vdots & \ddots & \vdots \\ \alpha_{m-1}^j + \alpha_{m-1}^{2j} & \alpha_{m-1}^{j+2} + \alpha_{m-1}^{2j+1} & \cdots & \alpha_{m-1}^{j+2(m-1)} + \alpha_{m-1}^{2j+m-1} \end{bmatrix} \\
&\quad \begin{bmatrix} x_0 \\ x_1 \\ \vdots \\ x_{m-1} \end{bmatrix} \\
&= [\, C^0 \alpha^j + Q\alpha^j \quad C^2\alpha^j + C^1 Q\alpha^j \quad \cdots \quad C^{2(m-1)}\alpha^j + C^{m-1}Q\alpha^j \,] \\
&\quad \begin{bmatrix} x_0 \\ x_1 \\ \vdots \\ x_{m-1} \end{bmatrix} \\
&= [\, (C^0+Q)\alpha^j \quad (C^2+C^1 Q)\alpha^j \quad \cdots \quad (C^{2(m-1)} + C^{m-1}Q)\alpha^j \,] \\
&\quad \begin{bmatrix} x_0 \\ x_1 \\ \vdots \\ x_{m-1} \end{bmatrix} \\
&= [\, T_0 S_1 \quad T_1 S_1 \quad \cdots \quad T_{m-1} S_1 \,] \begin{bmatrix} x_0 \\ x_1 \\ \vdots \\ x_{m-1} \end{bmatrix} \\
&= \sigma^{(1)}(x)
\end{aligned}
$$

The error locator polynomial can be described as $\sigma(x) = \sigma^{(1)}(x) + S_1^3 + S_3$. After m is decided, the matrix $T_0, T_1, \ldots T_{m-1}$ can be calculated in advance by the computer program, such a C/C++ or Matlab. Furthermore, the dimensions of the matrix $T_0, T_1, \ldots T_{m-1}$ are the same with the CFFM. We can consider them as a CFFM when we estimated the hardware. Therefore, we need only n+m CFFMs instead of 2n CFFMs to implement $\sigma^{(1)}(x)$ in the prior art, where n is the length of codeword and m is a parameter in $GF(2^m)$. In general, $m \geq \log_2 n$.

Figure 2:
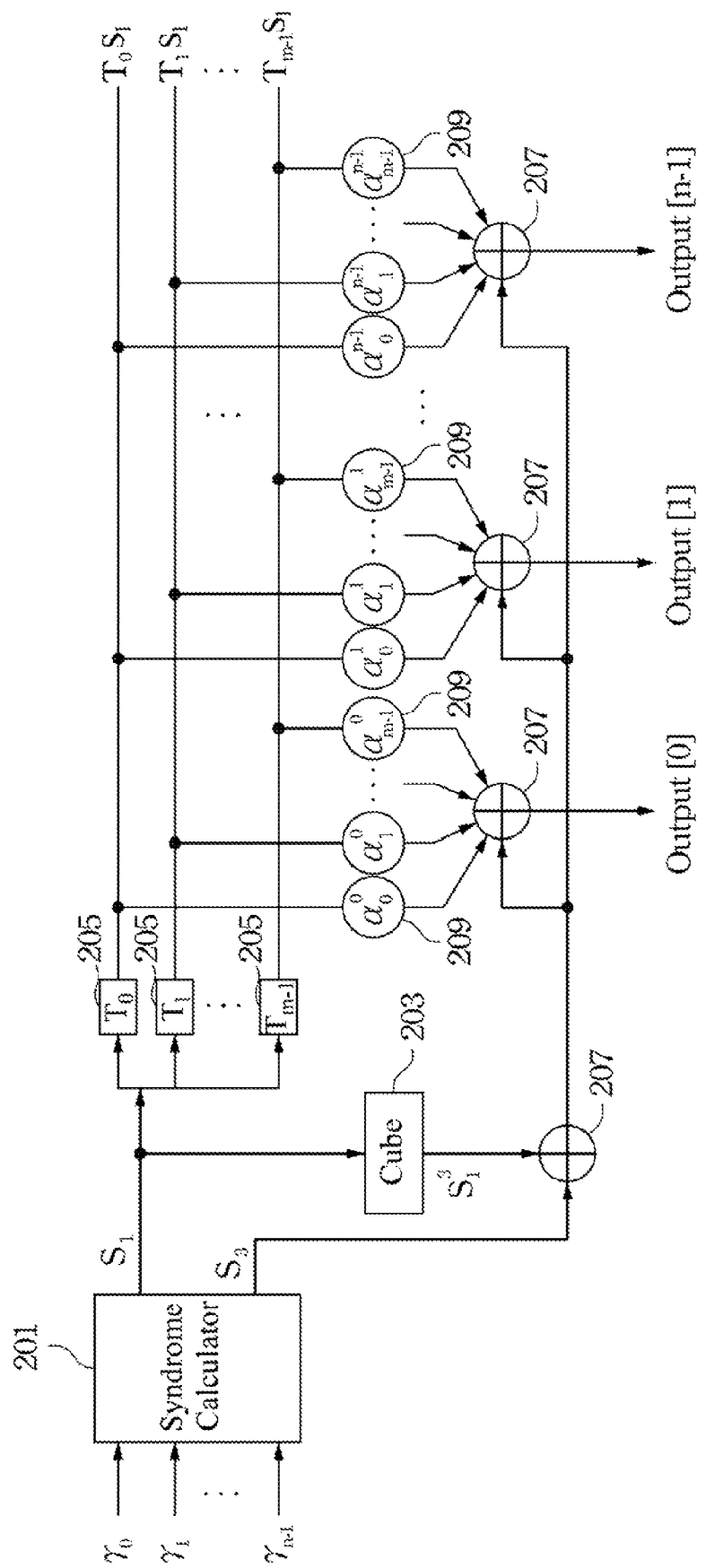
FIG. 2 is the schematic of the hardware of codec with the CFFM and the square according to one embodiment of this invention.

FIG. 2 shows the schematic of the hardware of codec with the CFFM and the square according to one embodiment of this invention. As shown in FIG. 2, a syndrome calculator 201 derives the $S_1$, $S_3$ from the codeword $r_0, r_1, \ldots, r_{n-1}$ received by the decoder. The cube 203 and the adder 207 derive $S_3 + S_1^3$ from the syndromes $S_1$ and $S_3$. Further, the circuit 205, the multiplier 209 and the adder 207 derive the output results Output[0], Output[1], …, Output[n−1] from the syndrome $S_1$ and the matrices $T_0, T_1, \ldots, T_{m-1}$. Then, we obtain the error locator polynomial $\sigma(x)$ from these output results.

Second Embodiment

The main idea of this method is that we generate n m-by-m matrices instead of the 2n CFFMs in Chien search. When the inputs of these matrices are the same, the error locator polynomial can be further optimized. Assuming that $S_1$ is $\alpha^j, \alpha^i$ is taking into $\sigma(x)$ when Chien search is applied and can be written as $\sigma(\alpha^i) = \sigma^{(1)}(\alpha^i) + S_1^3 + S_3$. Consider the $\sigma^{(1)}(\alpha^i)$ at first:

$$
\begin{aligned}
\sigma^{(1)}(\alpha^j) &= S_1 \alpha^{2i} + S_1^2 \alpha^j \\
&= \alpha^j \alpha^{2i} + \alpha^{2j} \alpha^i \\
&= \begin{bmatrix} \alpha_0^{2i} & \alpha_0^{2i+1} & \cdots & \alpha_0^{2i+m-1} \\ \alpha_1^{2i} & \alpha_1^{2i+1} & \cdots & \alpha_1^{2i+m-1} \\ \vdots & \vdots & \ddots & \vdots \\ \alpha_{m-1}^{2i} & \alpha_{m-1}^{2i+1} & \cdots & \alpha_{m-1}^{2i+m-1} \end{bmatrix} \begin{bmatrix} \alpha_0^j \\ \alpha_1^j \\ \vdots \\ \alpha_{m-1}^j \end{bmatrix} + \\
&\quad \begin{bmatrix} \alpha_0^i & \alpha_0^{i+1} & \cdots & \alpha_0^{i+m-1} \\ \alpha_1^i & \alpha_1^{i+1} & \cdots & \alpha_1^{i+m-1} \\ \vdots & \vdots & \ddots & \vdots \\ \alpha_{m-1}^i & \alpha_{m-1}^{i+1} & \cdots & \alpha_{m-1}^{i+m-1} \end{bmatrix} \begin{bmatrix} 1 & \alpha_0^2 & \cdots & \alpha_0^{2(m-1)} \\ 0 & \alpha_1^2 & \cdots & \alpha_1^{2(m-1)} \\ \vdots & \vdots & \ddots & \vdots \\ 0 & \alpha_{m-1}^2 & \cdots & \alpha_{m-1}^{2(m-1)} \end{bmatrix} \\
&\quad \begin{bmatrix} \alpha_0^j \\ \alpha_1^j \\ \vdots \\ \alpha_{m-1}^j \end{bmatrix} \\
&= L_i \cdot S_i
\end{aligned}
$$

Where L can be obtained by the computer program, such as C/C++ or Matlab, at first.

$$
L_i = \begin{bmatrix} \alpha_0^{2i} & \alpha_0^{2i+1} & \cdots & \alpha_0^{2i+m-1} \\ \alpha_1^{2i} & \alpha_1^{2i+1} & \cdots & \alpha_1^{2i+m-1} \\ \vdots & \vdots & \ddots & \vdots \\ \alpha_{m-1}^{2i} & \alpha_{m-1}^{2i+1} & \cdots & \alpha_{m-1}^{2i+m-1} \end{bmatrix} +
$$

$$
\begin{bmatrix} \alpha_0^i & \alpha_0^{i+1} & \cdots & \alpha_0^{i+m-1} \\ \alpha_1^i & \alpha_1^{i+1} & \cdots & \alpha_1^{i+m-1} \\ \vdots & \vdots & \ddots & \vdots \\ \alpha_{m-1}^i & \alpha_{m-1}^{i+1} & \cdots & \alpha_{m-1}^{i+m-1} \end{bmatrix} \begin{bmatrix} 1 & \alpha_0^2 & \cdots & \alpha_0^{2(m-1)} \\ 0 & \alpha_1^2 & \cdots & \alpha_1^{2(m-1)} \\ \vdots & \vdots & \ddots & \vdots \\ 0 & \alpha_{m-1}^2 & \cdots & \alpha_{m-1}^{2(m-1)} \end{bmatrix}
$$

Figure 3:
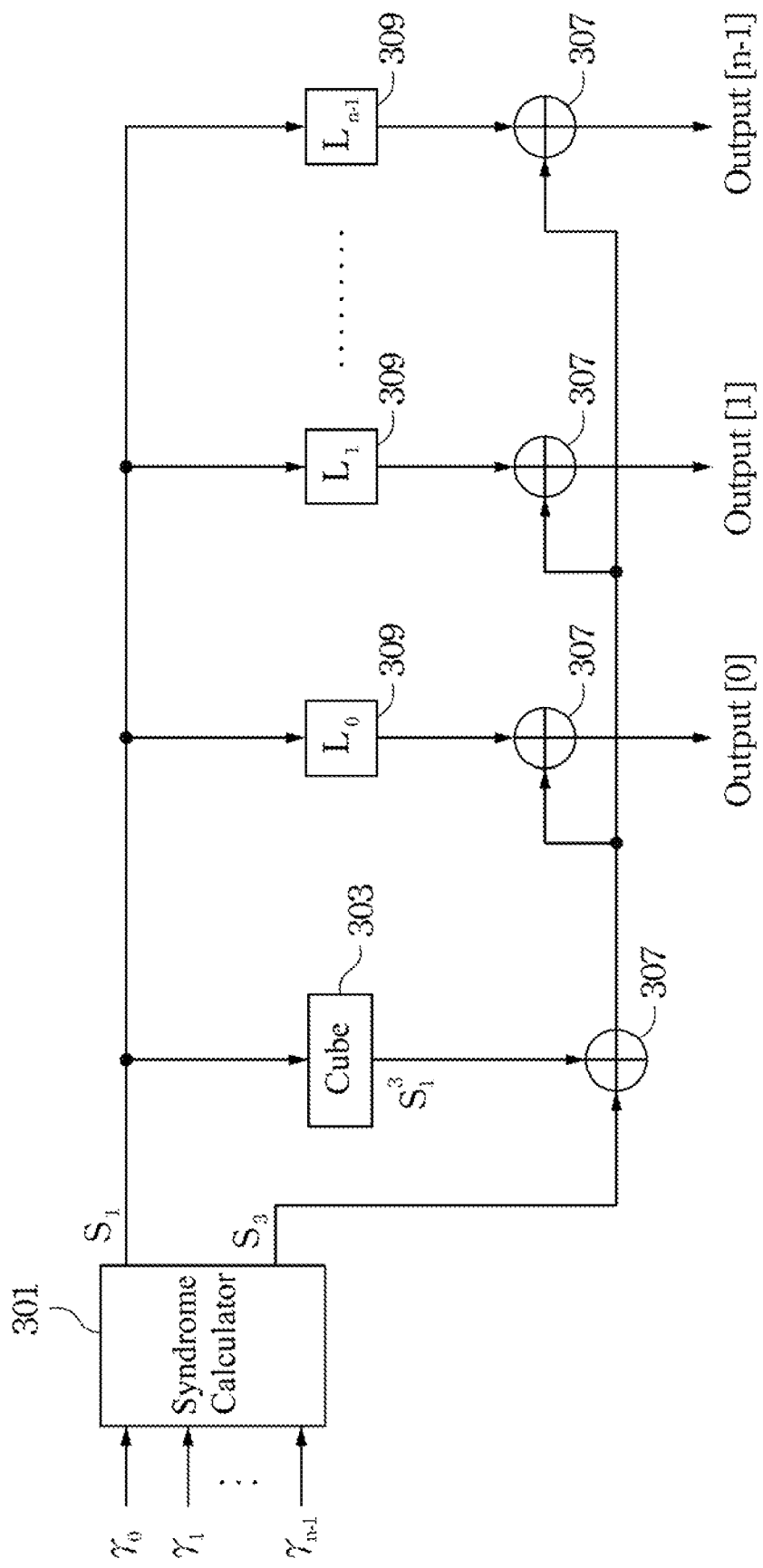
FIG. 3 is the schematic of the hardware of decoder with the n m-by-m matrices according to one embodiment of this invention.

FIG. 3 shows the schematic of the hardware of decoder with the n m-by-m matrices according to one embodiment of this invention. The syndrome calculator 301 derived the syndromes $S_1$, $S_3$ from the codeword $r_0, r_1, \ldots, r_{n-1}$. The cube 303 and the adder 307 derived $S_3 + S_1^3$. Afterwards, the multiplier 309 and adder 307 derived the error locator polynomial from the syndrome $S_1$ and the matrices $L_0, L_1, \ldots, L_{n-1}$.

TABLE 3

| | One embodiment of this invention | Prior Art |
|---|---|---|
| Component | Encoder + Decoder | Decoder |
| Technology | 90 nm | 180 nm |
| Cycles for operation | 1 | 1 |
| Latency (Synthesis) | 2.5 ns | 4.51 ns |
| Data Size (bits) | 256 | 256 |
| Throughput | 102.4 Gb/s | 56.76 Gb/s |
| Area ($um^2$) | 41,705 or 35,205 | 283,512 |
| Gate count | 14,789 or 12484 | N/A |

Table 3 demonstrates the comparison results of total (274, 256;2) BCH codec and the prior art, where the prior art is X. Wang, D. Wu, C. Hu, L. Pan, and R. Zhou, "Embedded high-speed BCH decoder for new-generation NOR flash memories," in IEEE Custom Integrated Circuits Conference, pp. 195-198, September 2009.

From the data of the table 3, the one embodiment of this invention not only has the advantage of the shorten latency of decoding but also uses less hardware than the prior art. Further, the method in one embodiment of this invention is in no way inferior to the related researches in the international conference. And it shows the method in one embodiment of this invention is very competitive and can suits to the actual products.

The following embodiments present the encoder, the decoder, and the memory system respectively. The encoder and decoder use the fully parallel architecture for increasing the encoding speed and decreasing the latency of decoding to meet the demand of the applications.

Figure 4:
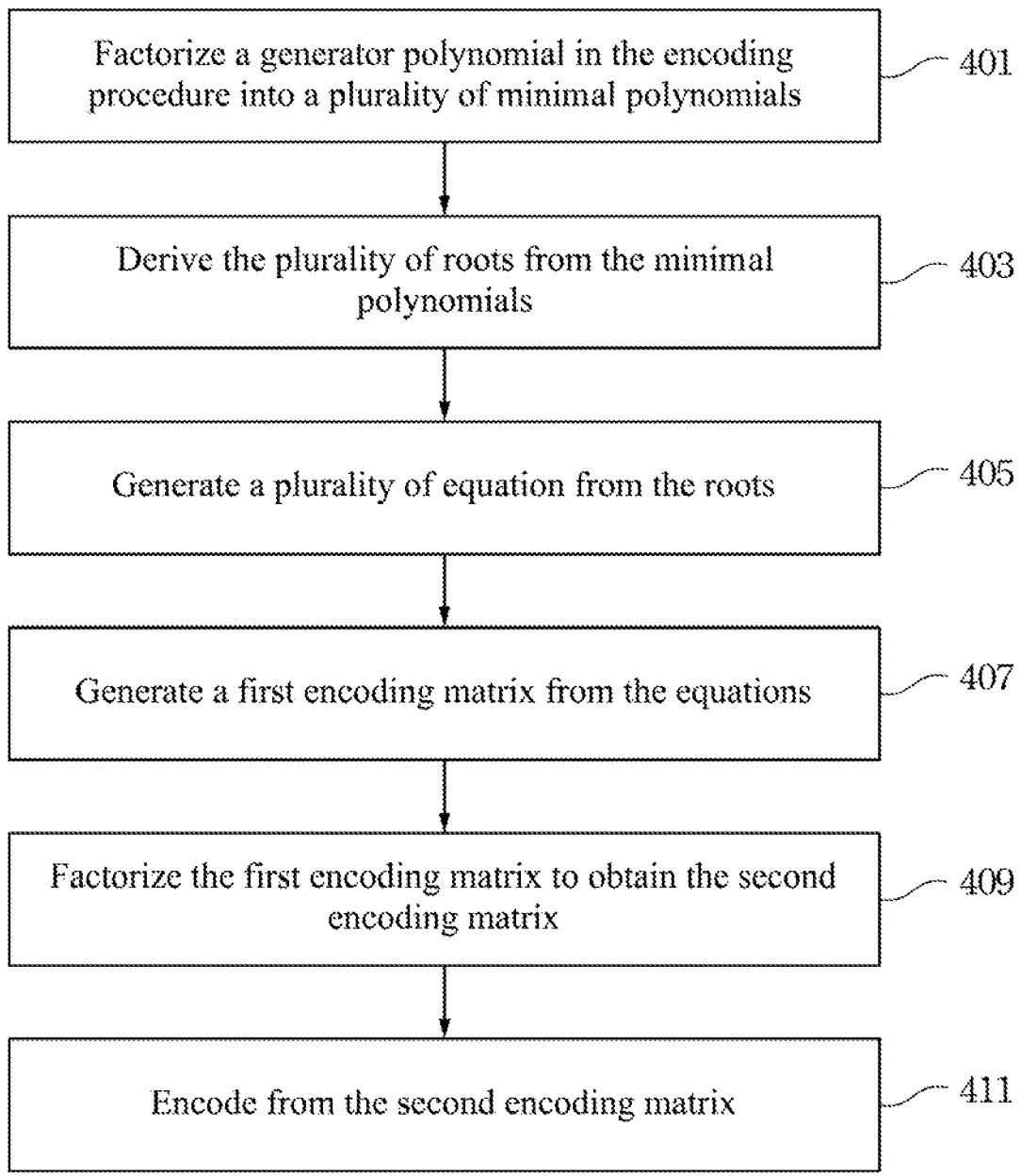
FIG. 4 is the flow chart of the method of fully parallel encoding of a memory system according to one embodiment of this invention.

Please refer to FIG. 4, which shows a flow chart of the method of fully parallel encoding of a memory system according to one embodiment of this invention. The encoding method in this embodiment is constructing a matrix from the roots, and then factorizing it.

The method of fully parallel encoding of the memory system factorizes a generator polynomial in the encoding procedure into a plurality of minimal polynomials (step 401), which is:

$$g(x) = LCM\{M_1(x), M_2(x), \ldots, M_{2t}(x)\},$$

Where $g(x)$ is the generator polynomial, $M_1(x)$, $M_2(x)$, ..., $M_{2t}(x)$ is the minimal polynomial; then deriving the plurality of roots from the minimal polynomials (step 403), which are $\alpha^i$ and its conjugates; further, generating a plurality of equation from the roots (step 405), which is $P(x) = u(x)x^{n-1}|_{x=\alpha^i}$ and their conjugates.

Then, generating a first encoding matrix $H_{EN}$ (step 407) from these equations, which is rewriting these equations in matrix form, $BP = AH_{EN}U$, where the matrix $H_{EN}$ is:

$$\begin{bmatrix} 1 & \alpha & \ldots & \alpha^{k-1} \\ 1 & \alpha^2 & \ldots & \alpha^{2\times(k-1)} \\ \ldots & \ldots & \ldots & \ldots \\ 1 & \alpha^{(2t-1)\times 2^{l_{t-1}-1}} & \ldots & \alpha^{(2t-1)\times 2^{l_{t-1}-1}(k-1)} \end{bmatrix}$$

Then, factorizing the first encoding matrix $H_{EN}$ (step 409), which is $H_{EN} = Q_{EN} \cdot \tilde{H}_{EN}$, to obtained the second encoding matrix, where the second encoding matrix $\tilde{H}_{EN}$ is obtained by the computer programs, such as C/C++ or Matlab.

As described earlier, the second encoding matrix is a sub-matrix of a parity check matrix $\tilde{H}_{SYN}$ of a decoder, where the parity check matrix $\tilde{H}_{SYN}$ is:

$$\tilde{H}_{SYN} = \begin{bmatrix} 1 & \alpha & \alpha^2 & \alpha^3 & \ldots & \alpha^{n-1} \\ 1 & \alpha^3 & (\alpha^3)^2 & (\alpha^3)^3 & \ldots & (\alpha^3)^{n-1} \\ \ldots & \ldots & \ldots & \ldots & \ldots & \ldots \\ 1 & \alpha^{2t-1} & (\alpha^{2t-1})^2 & (\alpha^{2t-1})^3 & \ldots & (\alpha^{2t-1})^{n-1} \end{bmatrix},$$

At last, encoding from the second encoding matrix (step 411). The parity bit required by the memory can be derived from the second encoding matrix $\tilde{H}_{EN}$ and the non-singular matrix B, which is $P = B^{-1} A Q_{EN} \tilde{H}_{EN} U$.

Figure 5:
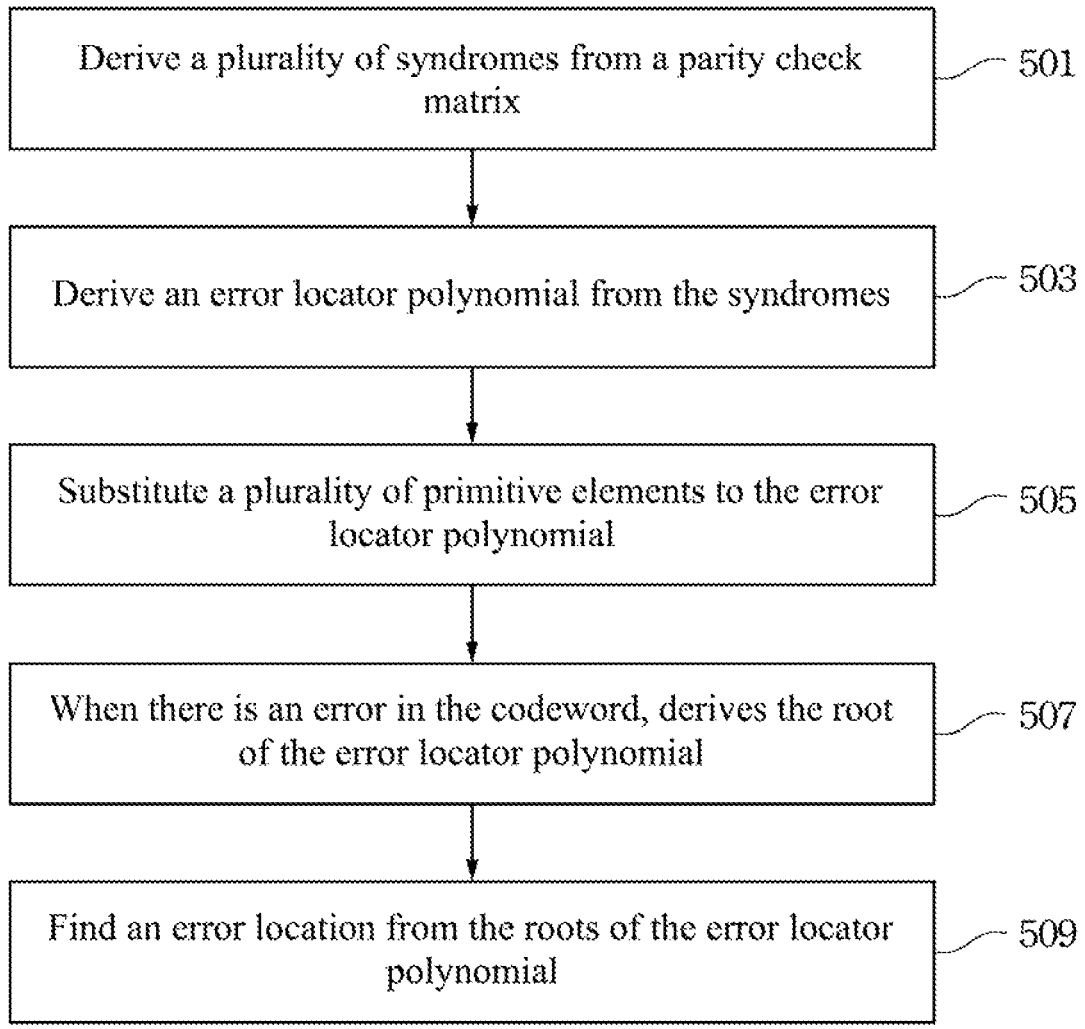
FIG. 5 is the flow chart of the method of fully parallel decoding of a memory system according to one embodiment of this invention.

Please refer to FIG. 5, which shows a flow chart of the method of fully parallel decoding of a memory system according to one embodiment of this invention. The decoding method in this embodiment defines a new error locator polynomial and uses the square to rearrange the equations.

The method of fully parallel decoding of a memory system derives a plurality of syndromes from a parity check matrix at first (step 501), where the partial elements of the parity check matrix $\tilde{H}_{SYN}$ are the same with the second encoding matrix $\tilde{H}_{EN}$ of the encoder, and the parity check matrix $\tilde{H}_{SYN}$ and the second encoding matrix $\tilde{H}_{EN}$ are derived in the embodiment of the FIG. 4.

Then, deriving an error locator polynomial from the syndromes (step 503), where the error locator polynomial is:

$$\sigma(x) = S_1 x^2 + S_1^2 x + S_1^3 + S_3$$

$$= [T_0 S_1 \quad T_1 S_1 \quad \ldots \quad T_{m-1} S_1] \begin{bmatrix} X_0 \\ X_1 \\ \ldots \\ X_{m-1} \end{bmatrix} + S_1^3 + S_3.$$

Where the $\sigma(x)$ is the error locator polynomial, $T_0$, $T_1$, $T_{m-1}$ are the matrices, and $S_1$ and $S_3$ are the syndromes; the matrices $T_0, T_1$ can be derived from the computer program, such as C/C++ or Matlab, which is performed by a computer system.

Then, substituting a plurality of primitive elements $\alpha^0$, $\alpha^1, \ldots, \alpha^{n-1}$ to the error locator polynomial (step 505). When there is an error in the codeword, deriving the root of the error locator polynomial (step 507). Further, finding an error location from the roots of the error locator polynomial (step 509), where if $\alpha^i$ is the root of the error locator polynomial, there is an error at the i-th location.

Figure 6:
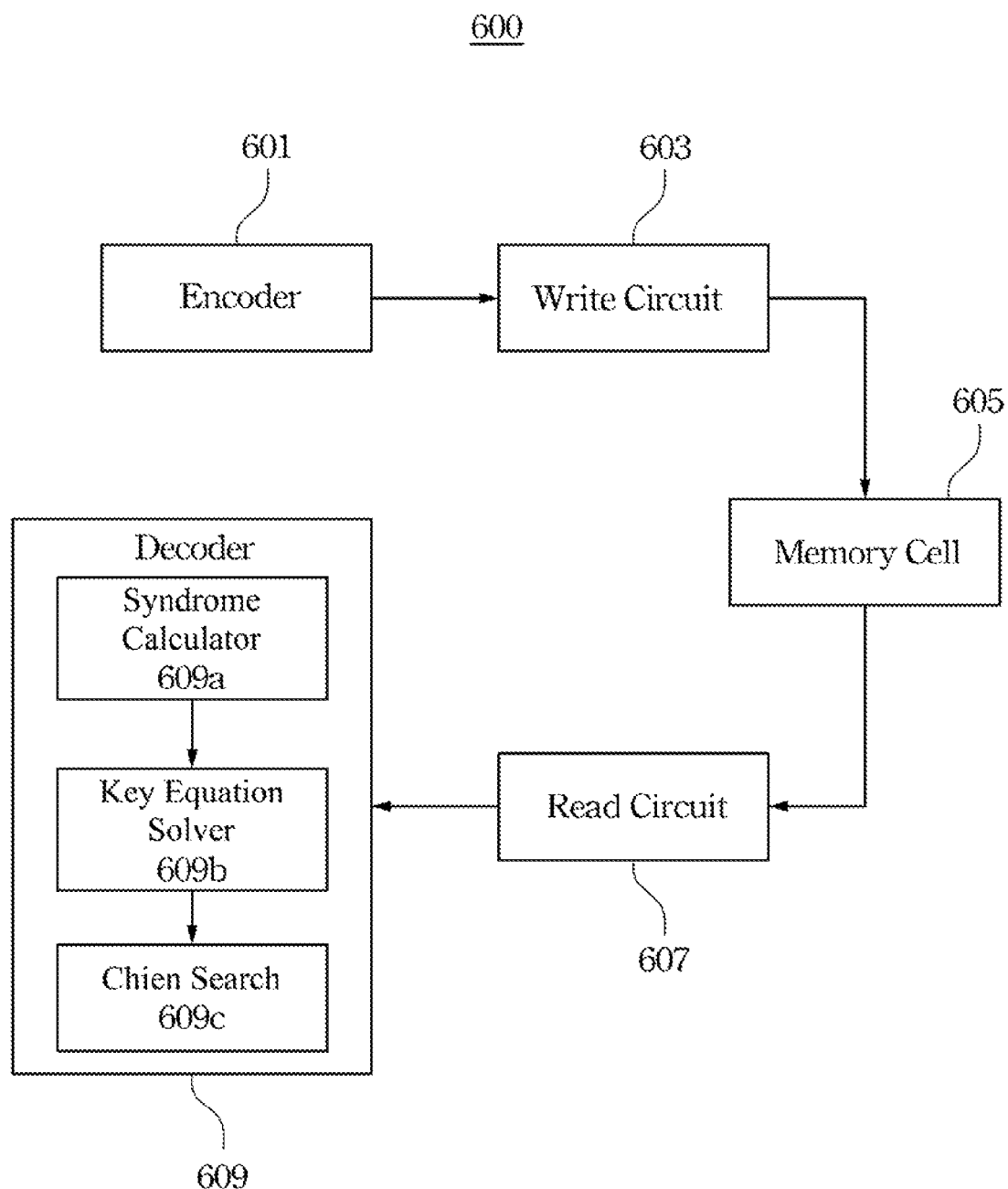
FIG. 6 is the block diagram of the memory system according to one embodiment of this invention.

Please refer to FIG. 6, which shows a block diagram of the memory system according to one embodiment of this invention. The memory system 600 includes an encoder 601, a write circuit 603, a memory cell 604, a read circuit 607, and a decoder 609. The encoder 601 encodes the input data from the aforesaid second encoding matrix for generating least one codeword c(x), where has the parity check bits. The write circuit 603 is electrically connected to the encoder 601 for transmitting the codeword to the memory cell 605. The memory cell 605 used for storing from the code word, wherein the memory cell is the NOR flash memory.

The read circuit 607 reads the data from the memory cell 605. The decoder 609 utilizes the parity check matrix to decode the data read from the memory cell 605, wherein the decoder 609 includes a syndrome calculator 609a, a key equation solver 609b, and a Chien search 609c. The syndrome calculator 609a calculates a plurality of syndromes. The key equation solver 609b is electrically connected to the syndrome calculator 609a for solving the error locator polynomials. The Chien search 609c is electrically connected to the key equation solver 609b for finding the error location from the error locator polynomial, wherein the syndrome calculator and the encoder are fully parallel architecture in this embodiment.

In the memory system 600, the decoder 609 and the encoder 601 is a combined circuit, each of them takes a cycle for operation respectively. The second encoding matrix used by the encoder 601 is a sub-matrix of the decoder 609. Due to the matrix used for operation of both them has the partial elements and the decoder 609 and the encoder 601 can't be driven at the same time, they can operate alone at the different time. So the encoder 601 and the decoder 609 can share the circuit, which corresponds to the matrix that has the partial elements, without the collision. Thus, the required circuits of hardware can be reduced.

The aforesaid memory system and the method of the fully parallel encoding and decoding use the fully parallel architecture to accomplish the operations of encoding and decoding in a short time. Due to the matrix used by the encoder and the decoder has the partial elements, the hardware of the codec can be shared. Further, the application of the new error locator polynomial can reduce the number of the CFFMs, which used for operation, to reduce the complexity of the required hardware and to accelerate the speed of operation.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of a fully parallel encoding of a memory system, the memory system comprising a memory cell, a writing circuit, a fully parallel encoder and a decoder, the method comprising the steps of:
    factorizing a generator polynomial into a plurality of minimal polynomials for the fully parallel encoder of the memory system;
    deriving the plurality of roots from the minimal polynomials;
    generating an encoding matrix from the plurality of roots;
    factorizing the encoding matrix into a plurality of factorized matrices, wherein one of the plurality of factorized matrices is a sub-matrix of a parity check matrix, the parity check matrix corresponding to a hardware circuit of a syndrome calculator of the decoder, the one of the plurality of factorized matrices corresponding to a portion of the hardware circuit;
    encoding a codeword by the fully parallel encoder using the portion of the hardware circuit; and
    transmitting the codeword to the memory cell via the writing circuit.

2. The method of claim 1, wherein the encoding matrix $H_{EN}$ is $$\begin{bmatrix} 1 & \alpha & \ldots & \alpha^{k-1} \\ 1 & \alpha^2 & \ldots & \alpha^{2\times(k-1)} \\ \ldots & \ldots & \ldots & \ldots \\ 1 & \alpha^{(2t-1)\times 2^{l_{2t-1}-1}} & \ldots & \alpha^{(2t-1)\times 2^{l_{2t-1}-1}(k-1)} \end{bmatrix},$$

and each elements of the second column of the encoding matrix $H_{EN}$ $$\begin{bmatrix} \alpha \\ \alpha^2 \\ \ldots \\ \alpha^{(2t-1)\times 2^{l_{2t-1}-1}} \end{bmatrix}$$

is the roots of the minimal polynomials, where t and k are a positive integer, and k represents a message length and t represents an error correcting capability.

3. The method of claim 1, wherein the plurality of factorized matrices are a sub-matrix of a parity check matrix of a decoder.

4. The method of claim 3, wherein the sub-matrix of the parity check matrix is $H_{EN}$ is $$\begin{bmatrix} 1 & \alpha & \ldots & \alpha^{k-1} \\ 1 & \alpha^3 & \ldots & \alpha^{3(k-1)} \\ \ldots & \ldots & \ldots & \ldots \\ 1 & \alpha^{2t-1} & \ldots & \alpha^{(2t-1)\times(k-1)} \end{bmatrix}.$$

5. A method of a fully parallel decoding of a memory system, the memory system comprising a memory cell, a reading circuit, an encoder and a fully parallel decoder, the method comprising the steps of:
    (a) reading data from the memory cell via the reading circuit;
    (b) deriving a plurality of syndromes from a parity check matrix and the data, wherein a factorized matrix used by the encoder is a sub-matrix of the parity check matrix, the parity check matrix corresponding to a hardware circuit of a syndrome calculator of the fully parallel decoder, the factorized matrix corresponding to a portion of the hardware circuit, wherein the data is encoded by the encoder using the portion of the hardware circuit;
    (c) deriving an error locator polynomial from the syndromes;
    (d) substituting a plurality of primitive elements to the error locator polynomial for obtaining a plurality of roots of the error locator polynomial; and
    (e) finding an error location from the roots of the error locator polynomial.

6. The method of claim 5, wherein the step (c) further comprising the step of reducing the degree of error locator polynomial for the operation.

7. The method of claim 6, wherein the steps of reducing the degree of error locator polynomial comprising the steps of:
    utilizing a square matrix operation to combine the operation of the odd and the even degrees of the error locator polynomial.

8. A memory system, comprising:
    an encoder for utilizing an encoding matrix to encode an input data for generating a codeword;
    a memory cell for storing from the codeword;
    a write circuit electrically connected to the encoder for transmitting the codeword to the memory cell;
    a read circuit for reading the data from the memory cell; and
    a decoder for utilizing a parity check matrix to decode a data read from the memory cell;
    wherein the encoding matrix is the multiplication of a plurality of factorized matrices, and one of the plurality of factorized matrices is a sub-matrix of the parity check matrix.

9. The memory system of claim 8, wherein the encoder factorizes a generator polynomial in the encoding procedure into a plurality of minimal polynomials and then derives the plurality of roots from the minimal polynomials, and the encoder generates an encoding matrix from the plurality of roots or factorizes them into a plurality of factorized matrices.

10. The memory system of claim 9, wherein the factorized matrices generated by the encoder are a sub-matrix of a parity check matrix of the decoder.

11. The memory system of claim 10, wherein the submatrix of the parity check matrix is $$\begin{bmatrix} 1 & \alpha & \ldots & \alpha^{k-1} \\ 1 & \alpha^3 & \ldots & \alpha^{3(k-1)} \\ \ldots & \ldots & \ldots & \ldots \\ 1 & \alpha^{2t-1} & \ldots & \alpha^{(2t-1)\times(k-1)} \end{bmatrix}.$$

12. The memory system of claim 8, wherein the encoding matrix $H_{EN}$ is $$\begin{bmatrix} 1 & \alpha & \ldots & \alpha^{k-1} \\ 1 & \alpha^2 & \ldots & \alpha^{2\times(k-1)} \\ \ldots & \ldots & \ldots & \ldots \\ 1 & \alpha^{(2t-1)\times 2^{l_{t-1}}-1} & \ldots & \alpha^{(2t-1)\times 2^{l_{t-1}}-1(k-1)} \end{bmatrix}.$$

13. The memory system of claim 8, wherein the decoder comprises:

a syndrome calculator for deriving a plurality of syndromes from the parity check matrix, wherein the partial elements of the parity check matrix are common in a factorized matrix of the encoder;

a key equation solver electrically coupled to the syndrome calculator for solving an error locator polynomial; and a Chien search electrically coupled to the key equation solver for obtaining a root of the error locator polynomial from the error locator polynomial and finding the error location from the root of the error locator polynomial.

14. The memory system of claim 8, wherein the decoder substitutes a plurality of primitive elements to the error locator polynomial for obtaining the root of the error locator polynomial, whereby reducing the degrees of the error locator polynomial for the operation.

15. The memory system of claim 14, wherein the decoder utilizes square operation to combine the operation of the odd and the even degrees of the error locator polynomial, whereby reduces the degrees of the error locator polynomial for the operation.

* * * * *